United States Patent
Borot et al.

(10) Patent No.: US 7,755,960 B2
(45) Date of Patent: Jul. 13, 2010

(54) MEMORY INCLUDING A PERFORMANCE TEST CIRCUIT

(75) Inventors: Bertrand Borot, Le Cheylas (FR); Emmanuel Bechet, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 89 days.

(21) Appl. No.: 12/333,426

(22) Filed: Dec. 12, 2008

(65) Prior Publication Data

US 2009/0154273 A1    Jun. 18, 2009

(30) Foreign Application Priority Data

Dec. 17, 2007    (FR)    .................................... 0759905

(51) Int. Cl.
    *G11C 29/00*    (2006.01)
(52) U.S. Cl. .................... 365/201; 365/63; 365/189.08; 365/202; 714/718; 714/733; 714/734; 714/741
(58) Field of Classification Search ................. 365/201, 365/63, 189.08, 202
    See application file for complete search history.

(56) References Cited

U.S. PATENT DOCUMENTS

| | | | |
|---|---|---|---|
| 5,309,444 A * | 5/1994 | Dartois et al. ............... | 714/710 |
| 5,377,152 A * | 12/1994 | Kushiyama et al. ..... | 365/210.12 |
| 5,457,699 A * | 10/1995 | Bode et al. .................. | 714/727 |
| 5,684,809 A * | 11/1997 | Stave et al. ................. | 714/738 |
| 5,687,178 A * | 11/1997 | Herr et al. ................... | 714/721 |
| 5,742,548 A * | 4/1998 | Bahout et al. ............... | 365/201 |
| 5,790,452 A * | 8/1998 | Lien ........................... | 365/154 |
| 5,808,960 A * | 9/1998 | McClure ................. | 365/233.16 |
| 6,208,572 B1 * | 3/2001 | Adams et al. ............... | 365/201 |
| 6,216,239 B1 * | 4/2001 | Lien ........................... | 714/718 |
| 6,762,966 B1 * | 7/2004 | LaRosa et al. .............. | 365/201 |
| 6,778,457 B1 * | 8/2004 | Burgan ....................... | 365/222 |
| 6,928,376 B2 * | 8/2005 | Rodriguez et al. .......... | 702/118 |
| 6,934,899 B2 * | 8/2005 | Yuan et al. .................. | 714/734 |
| 6,943,581 B1 * | 9/2005 | Cruz et al. .................... | 326/41 |
| 7,099,182 B2 * | 8/2006 | Ohtake et al. ............... | 365/154 |
| 7,301,835 B2 * | 11/2007 | Joshi et al. .................. | 365/201 |
| 7,392,448 B2 * | 6/2008 | De Poorter et al. .......... | 714/726 |
| 7,414,904 B2 * | 8/2008 | Ehrenreich et al. .......... | 365/201 |
| 7,505,340 B1 * | 3/2009 | Adams et al. ............... | 365/201 |
| 7,515,502 B1 * | 4/2009 | Ahsan et al. ........... | 365/230.03 |

(Continued)

OTHER PUBLICATIONS

Preliminary Search Report; FR 0759905; Apr. 28, 2008.

*Primary Examiner*—Viet Q Nguyen
(74) *Attorney, Agent, or Firm*—Hogan Lovells US LLP

(57) ABSTRACT

A memory includes a plurality of memory cells each including a true data input connected to a true bit line and complementary data input connected to a complementary bit line, and two inverters connected head-to-tail firstly to the true data input and secondly to the complementary data input. The memory also includes a test circuit includes a plurality of test cells, each test cell includes a true data input connected to a complementary data input of the preceding test cell and a complementary data input connected to the true data input of the following test cell, the complementary data input of the last test cell being connected to the true data input of the first test cell, each test cell comprising a first inverter connected between the true data input and the complementary data input. The looped chain thus formed propagates a signal whose period is a function of the performance of the storage cells.

20 Claims, 1 Drawing Sheet

U.S. PATENT DOCUMENTS

| | | |
|---|---|---|
| 2004/0061561 A1 | 4/2004 | Monzel et al. |
| 2006/0050600 A1 | 3/2006 | Venkatraman et al. |
| 2006/0097802 A1 | 5/2006 | Chan et al. |
| 2007/0237012 A1 | 10/2007 | Kuang et al. |

* cited by examiner

MEMORY INCLUDING A PERFORMANCE TEST CIRCUIT

RELATED APPLICATION

The present application claims priority of French Patent Application No. 0759905 filed Dec. 17, 2007, which is incorporated herein in its entirety by this reference.

FIELD OF THE INVENTION

The invention pertains to a memory comprising a plurality of memory cells each comprising a true data input connected to a true bit line and a complementary data input connected to a complementary bit line, and two inverters connected head-to-tail firstly to the true data input and secondly to the complementary data input.

RELEVANT BACKGROUND

The plurality of memory cells is most commonly distributed over a memory area comprising M memory words each comprising N memory cells where M and N are integers and M*N is the size of the memory. Each of the memory cells of a same word also has a control input connected to a same word line and each of the same-ranking cells of each of the words has a data input connected to a same-ranking bit line and a complementary data input connected to a same-ranking complementary bit line.

The memory also has means not shown in the FIGURE, especially selection means to select a cell in the memory, and read means and write means for each memory cell.

The complexity of integrated circuits (the growing number of memory elements, the ever smaller surface area of each memory cell, etc.) goes together with a corresponding increase in the complexity of the manufacturing methods and the variability in the performance of integrated circuits, related to the manufacturing method, i.e. the variability in the performance of the integrated memories coming from a same silicon wafer or from a same batch of wafers.

The insertion of performance testing means into integrated circuits has therefore become a necessity in order to ensure that the circuits perform well and/or improve the performance of the manufacturing methods.

A prior-art testing method (known as the BIST for Built-In Self Test) consists in adding internal test circuits to the memory in order to test the performance of the memory cell. This technique generally has a non-negligible cost. It significantly increases the size (in terms of silicon surface area) of the integrated circuit memory and lowers its performance.

SUMMARY OF THE INVENTION

An object of the invention is a memory comprising a new type of performance test circuit without the drawbacks of known test methods.

To this end, the invention proposes a memory which is also in conformity with a memory as described in the foregoing introduction, and which also comprises a test circuit (200) comprising a plurality of test cells (CT11, . . . , CT1N, CT2N, . . . , CT21), each test cell comprising a true data input connected to a complementary data input of the preceding test cell and a complementary data input connected to the true data input of the following test cell, the complementary data input of the last test cell (CT21) being connected to the true data input of the first test cell (CT11) to form a looped chain, each test cell comprising a first inverter (I1 or I2) connected between the true data input and the complementary data input.

The looped chain formed by the plurality of test cells oscillates naturally, and propagates a periodic signal whose period is a function of the time of propagation of the signal within a test cell.

Since the test cells are made according to a scheme that is close to the scheme by which the memory cells are made, the electrical behavior and performance of the of the test cells similar to the electrical behavior and performance of the memory cells. Thus, by measuring the period of the signal propagated within the looped chain, it is possible to determine the performance of the test cells and, from this, deduce the performance of the memory cells, especially the time taken to access a memory cell, the time in which a memory cell changes state etc.

A test cell can be complemented by a second inverter (I2 or I1) one input of which is connected to an output of the first inverter (I1 or I2). This second inverter provides an additional electrical charge at the output of the first inverter, this additional charge truly existing in the memory cells. The addition of the second inverter thus enables the making of a test cell whose behavior is even closer to that of a memory cell.

Again, the true data input of a test cell (CTij) can be connected either to a true bit line (BLTj) or to a complementary bit line (BLFj). This enables the electrical charging of the true data input of a test cell in the same way as the true data input of a memory cell is charged; the behavior of a test cell is thus even closer to the behavior of a memory cell.

Just as in the case of a memory cell (Cij), a test cell (CTij) may also comprise:
- a true access transistor comprising a channel connected between the true data input and the input of the first inverter (I1 or I2), and
- a complementary access transistor comprising a channel connected between the complementary data input and the output of the first inverter, the true access transistor and the complementary access transistor also having a control electrode connected to a control input of the memory cell or of the test cell.

A test cell is thus made almost identically to a memory cell, the sole difference between the two then being the absence of a link between the output of the second inverter and the input of the first inverter. The making of the test cells is thus facilitated and their performance is as close as possible to that of the memory cells.

In one variant, the test circuit (200) may also include an inhibition circuit to open the looped chain when it receives a test control signal (VAL). The inhibition circuit thus enables the deactivation of the looped chain (i.e. the test circuit) outside the phases in which the memory is tested, thus limiting overall memory consumption.

According to another variant, the test circuit is deactivated through the application of an inactive signal to the control input of the test cells.

The looped chain oscillates naturally if it has a total number of inverter elements that is an odd number. In one variant, the test circuit has an odd number of test cells. In another variant, if the inhibition circuit has an inverter element, the test circuit has an even number of test cells.

BRIEF DESCRIPTION OF THE DRAWING

The invention will be understood more clearly and other features and advantages shall appear from the following description of an example of an SRAM memory according to the invention. The description is to be read with reference to the appended drawing in which the FIG. 1 is a schematic drawing showing the principle of a memory according to the invention.

DETAILED DESCRIPTION OF ONE EMBODIMENT

Figure 1:
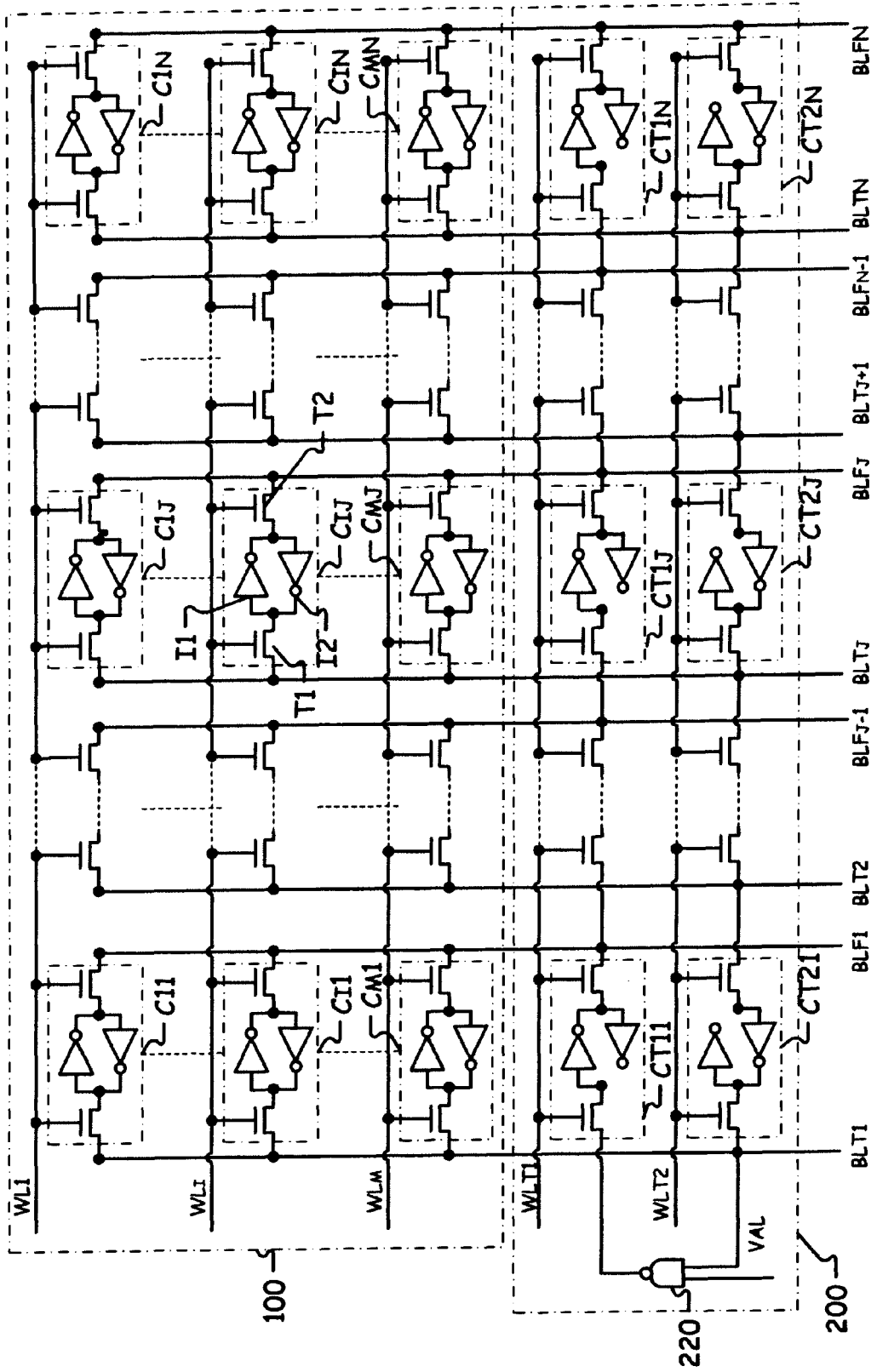

As stated here above, a memory according to the invention, like a prior-art memory, comprises a memory area 100 comprising a plurality of memory cells C11, . . . C1N, C21, . . . , CM1, CMN, distributed among M memory words WORD1, . . . , WORDM each comprising N memory cells C11 to C1N, C21 to C2N, . . . , CM1 to CMN, where M and N are integers and M*N is the size (in terms of storage capacity) of the memory.

All the cells of a same word WORDi (cells C11 to C1N of the word WORD1, cells C21 to C2N of the word WORD2, . . . , cells CM1 to CMN of the word WORDN) also have a control input connected to a same word line WLi ranked (WL1, WL2, . . . or WLN), and all the cells of a same rank j from 1 to N of each of the words WORD1, WORD2, WORDN each have a true data input connected to a bit line BLTj ranked j and a complementary data input linked to a complementary bit line BLFj ranked j.

Each cell Cij has a memory element comprising two inverters I1, I2 connected head-to-tail to the true data input by means of a channel of an access transistor T1 and to the complementary data input by means of a channel of a complementary access transistor T2. The control electrodes (gates) of the transistors T1, T2 are connected to the control input of the memory cell Cij.

The memory also has known means not shown in the FIGURE, especially selection means to select a cell in the memory, and read means and write means for each memory cell.

A memory according to the invention can be distinguished from a known memory by the fact that it also comprises a test circuit comprising a plurality of test cells associated to form a looped chain:
  each test cell has a data input connected to a complementary data input of the preceding test cell and a complementary data input connected to the data input of the following test cell.
  the complementary data input of the last test cell is connected to the data input of the first test cell.

In the example shown, the test circuit has two packets (similar to a memory word) of N test cells, stringed in the following order: CT11, . . . CT1N, CT21, CT2N:
  each test cell CT12, CT13, . . . , CT1N-1, CT1N, CT2N, CT2N-1, . . . , CT23, CT22 comprises a true data input connected to a complementary data input of the preceding test cell CT11, CT12, . . . , CT1N-2, CT1N-1, CT1N, CT2N, . . . , CT24, CT23, and one complementary data input connected to the true data input of the following test cell CT13, CT14, . . . , CT1N, CT2N, CT2N-1, CT2N-2, . . . , CT22, CT21; the cell CT1N thus precedes the cell CT2N in the chain;
  the complementary data input of the last test cell CT21 is connected to the true data input of the first test cell CT11.

Each test cell has a first inverter I1 or I2 connected between the data input and the complementary data input.

In the example shown, each test cell also has a second inverter I2 or I1, one input of which is connected to the output of the first inverter I1 or I2. The output of the second inverter I2 is not connected. Thus, in the example shown, the only difference between the memory cell and the test cell is that there is no connection between the output of the second inverter and the input of the first inverter in the test cell. The test cells and the memory cells are thus as close to each other as possible.

In a memory according to the invention again:
  the true data input of a test cell is linked to the true bit line
  or
  the complementary data input of a test cell is linked to the complementary bit line.

Thus, in the example shown, the complementary data input of each test cell CT1j ranked j of the test cell packet CT11 to CT1N is connected to the complementary bit line BLFj having the same rank j and the true data input of each test cell CT2j ranked j of the test cell packet CT21 to CT1N is connected to the true bit line BLTj having a same rank j.

Since, moreover, the test cells are interconnected, the true data input and the complementary data input of a same test cell are each connected to a bit line so that the equivalent electrical charge at each of the data inputs of a test cell is the same as the equivalent electrical charge at each of the data inputs of a memory cell.

Like a memory cell Cij, a test cell CTij also has:
  a true access transistor T1 comprising a channel connected between the true data input and the input of the first inverter (I1 or I2), and
  a complementary access transistor T2 comprising a channel connected between the complementary data input and the output of the first inverter, the first transistor T1 and the second transistor T2 also have a control electrode connected to the control input of the test cell.

Thus, in this embodiment, a test cell can be distinguished from a memory cell solely by the absence of a connection between the output of the second inverter and the input of the first inverter. The electrical behavior and the performance of a test cell are thus the same as those of a memory cell.

In one variant, the test circuit 200 also has an inhibition circuit to open the looped chain when it receives a test control signal VAL. Thus, outside the phases for testing the memory, it is possible to deactivate the looped chain by opening the loop, to prevent especially unnecessary energy consumption. In the example shown, the inhibition circuit comprises a logic gate 220 comprising a first input to which the test control signal VAL is applied, a second input connected to the complementary data input of a test cell, in this case the cell CT2N, and an output connected to the true data input of a following test cell in the looped chain, in this case the cell CT11. Here, the logic gate is of the NAND type. Other inhibition circuits can be envisaged, for example another type of gate (AND, OR, etc) or else a switch for which the opening/closing is controlled by the signal VAL.

In another variant, the test circuit is deactivated through the application of an inactive signal to the control inputs of the test cells.

The looped chain formed by the association of the test cells oscillates naturally, through the simple application of a signal representing a logic "1" or logic "0" to any unspecified bit line.

The test circuit has an odd number of inverter elements, preferably greater than 3, so that there is a propagation of the signal within the looped chain. In one embodiment, the test circuit has an odd number of test cells, each comprising an inverter linked between the true data input and the complementary data input of the test cell. In the memory shown in the FIGURE, the inhibition circuit comprises an inverter element (the NAND gate has one inverter output) and the test circuit has an even number (2*N) of test cells. The test circuit thus has an odd number of inverter elements.

The tests on the memory are performed very simply through the application of an appropriate signal VAL to loop the chain of test cells, in applying an active signal to the word lines WLT1, WLT2 to select and activate all the test cells, and in applying a signal "1" or "0" to a bit line, i.e. to one of the data inputs of one of the test cells. The signal is then propagated from one test cell to another. At one data input of a test cell, a periodic signal appears, with a period equal to twice the time of propagation of the signal through the set of test cells included in the looped chain; i.e. a period $P=2*NB*t0+td$, where NB is the total number of test cells included in the chain, $t0$ is the mean time of access to a test cell (or switch-over time for an inverter), identical to the time of access to a memory cell and td is the transit time of the signal propagated in the inhibition circuit, if of course such an inhibition circuit is present in the chain.

Using the information in the signal propagated in the looped chain (especially information on the period of this signal), it is possible to obtain information on the performance of the memory cells and hence on the memory itself. So that it can be exploited, the propagated signal can be extracted from the memory by a connection, for example, of the true data input or the complementary data input of a test cell to an output terminal of the memory.

The choice of the total number of test cells is a compromise between the precision desired for the tests and the total surface area of silicon occupied by the memory. Increasing the number of test cells makes it possible to get rid of the problems of variability in performance from one test cell to another, this variability being the same as the variability from one memory cell to another, and hence improves the quality of the test results. However, the increase in the number of test cells naturally increases the surface area of silicon occupied by the memory.

In the example shown, the memory cells of the plurality of the memory cells are grouped in M packets (or memory words) of N memory cells and the test circuit has two packets of N test cells. The control inputs of the test cells of the first packet, and of the second packet respectively, are connected to a same word line WLT1, WLT2 respectively. Again, the links between the test cells used to form the looped chain are preferably made so as to minimize the length of these links and cause all the links to have the same length as far as possible.

To test the memory, active signals are applied to the word lines WLT1, WLT2. The signal VAL is also active. An active signal is applied to a true bit line or to a complementary bit line. This signal will subsequently be propagated from one test cell to another, causing the oscillation of the chain of test cells.

Outside the phases in which the memory is tested, the memory can be used normally, through the inhibiting the test circuit (with inactive signals sent to the word lines WLT1, WLT2, the signal VAL being inactive), and the selection of one or more memory cells classically by activating the appropriate word line or lines and the appropriate bit line or lines.

While there have been described the present invention in conjunction with specific components and circuitry, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A memory comprising:
    a plurality of memory cells each comprising a true data input connected to a true bit line and complementary data input connected to a complementary bit line, and two inverters connected head-to-tail to the true data input and to the complementary data input;
    a test circuit comprising a plurality of test cells, each test cell comprising a true data input connected to a complementary data input of the preceding test cell and a complementary data input connected to the true data input of the following test cell, the complementary data input of the last test cell being connected to the true data input of the first test cell to form a looped chain, each test cell comprising a first inverter connected between the true data input and the complementary data input.

2. Memory according to claim 1, wherein a test cell also comprises a second inverter, one input of which is connected to an output of the first inverter.

3. Memory according to claim 1 wherein either
    the true data input of a test cell is connected to the true bit line or
    the complementary data input of a test cell is connected to the complementary bit line.

4. Memory according to claim 2 wherein either
    the true data input of a test cell is connected to the true bit line or
    the complementary data input of a test cell is connected to the complementary bit line.

5. Memory according to claim 1, wherein at least one memory cell or test cell further comprises:
    a true access transistor comprising a channel connected between the true data input and the input of the first inverter, and
    a complementary access transistor comprising a channel connected between the complementary data input and the output of the first inverter,
wherein the true access transistor and the complementary access transistor also having a control electrode connected to a control input of the memory cell or of the test cell.

6. Memory according to claim 2, wherein at least one memory cell or test cell further comprises:
    a true access transistor comprising a channel connected between the true data input and the input of the first inverter, and
    a complementary access transistor comprising a channel connected between the complementary data input and the output of the first inverter,
wherein the true access transistor and the complementary access transistor also having a control electrode connected to a control input of the memory cell or of the test cell.

7. Memory according to claim 3, wherein at least one memory cell or test cell further comprises:
- a true access transistor comprising a channel connected between the true data input and the input of the first inverter, and
- a complementary access transistor comprising a channel connected between the complementary data input and the output of the first inverter, wherein the true access transistor and the complementary access transistor also having a control electrode connected to a control input of the memory cell or of the test cell.

8. Memory according to claim 1, wherein the test circuit also comprises an inhibition circuit to open the looped chain when it receives a test control signal.

9. Memory according to claim 2, wherein the test circuit also comprises an inhibition circuit to open the looped chain when it receives a test control signal.

10. Memory according to claim 3, wherein the test circuit also comprises an inhibition circuit to open the looped chain when it receives a test control signal.

11. Memory according to claim 5, wherein the test circuit also comprises an inhibition circuit to open the looped chain when it receives a test control signal.

12. Memory according to claim 8, wherein the inhibition circuit comprises a logic gate comprising a first input to which the test control signal is applied, a second input connected to the complementary data input of a test cell and an output connected to the true data input of a following test cell.

13. Memory according claim 1, wherein the test circuit comprises an odd number of test cells.

14. Memory according to claim 2, wherein the test circuit comprises an odd number of test cells.

15. Memory according to claim 3, wherein the test circuit comprises an odd number of test cells.

16. Memory according to claim 5, wherein the test circuit comprises an odd number of test cells.

17. Memory according to claim 8 wherein if the inhibition circuit comprises an inverter element, the test circuit comprises an even number of test cells.

18. Memory according to claim 12, wherein if the inhibition circuit comprises an inverter element, the test circuit comprises an even number of test cells.

19. Memory according to claim 17, wherein the memory cells of the plurality of memory cells are grouped together in M packets of N memory cells and wherein the test circuit comprises two packets of N test cells.

20. Memory according to claim 18, wherein the memory cells of the plurality of memory cells are grouped together in M packets of N memory cells and wherein the test circuit comprises two packets of N test cells.

* * * * *